United States Patent [19]

Wilhelm et al.

[11] Patent Number: 4,634,994
[45] Date of Patent: Jan. 6, 1987

[54] BIPOLAR LOGICAL CIRCUIT ARRANGEMENT FOR SIGNAL REGENERATION

[75] Inventors: Wilhelm Wilhelm; Peter Sehrig, both of Munich, Fed. Rep. of Germany

[73] Assignee: Siemens Aktiengesellschaft, Berlin and Munich, Fed. Rep. of Germany

[21] Appl. No.: 733,533

[22] Filed: May 13, 1985

[30] Foreign Application Priority Data

May 16, 1984 [DE] Fed. Rep. of Germany ....... 3418214

[51] Int. Cl.$^4$ .............................................. H03F 3/45
[52] U.S. Cl. ..................................... 330/260; 330/252
[58] Field of Search ............... 330/252, 259, 260, 261, 330/258

[56] References Cited

U.S. PATENT DOCUMENTS

Re. 30,572  4/1981  Steckler ............................. 330/252

FOREIGN PATENT DOCUMENTS 111374  7/1964  Czechoslovakia .................. 330/252
0095824  1/1983  European Pat. Off. .

OTHER PUBLICATIONS

Proceedings of the IEEE, vol. 65, No. 12, Dec. 1977.
IEEE Journal of Solid-State Circuits, vol. SC-16, No. 6, Dec. 1981.

Primary Examiner—Eugene R. LaRoche
Assistant Examiner—Steven J. Mottola
Attorney, Agent, or Firm—Herbert L. Lerner; Laurence A. Greenberg

[57] ABSTRACT

A bipolar semiconductor circuit arrangement with transistors of one conduction type having a differential amplifier stage formed by a first and a second transistor with collectors coupled back crosswise to bases thereof and with emitters thereof connected to terminal of a current source having another terminal which is at supply potential, the first and second transistors having a collector circuit wherein a respective resistance is connected includes a pair of control transistors having collector-emitter paths connected between the respective resistances and the collectors of the first and second transistors of the differential amplifier stage, the control transistors having respective base terminals serving as a source of complimentary input signals, and having respective collectors connected to a source of complementary output signals.

1 Claim, 3 Drawing Figures

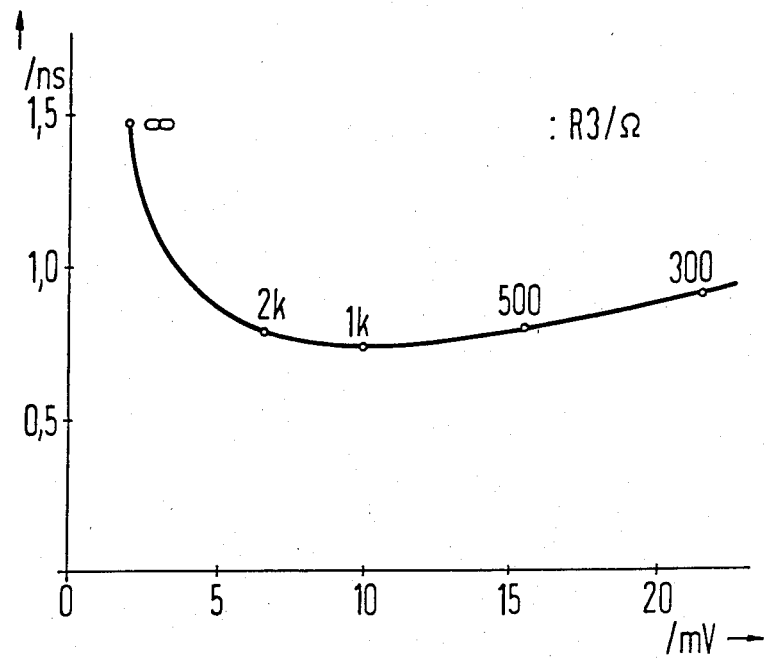

BIPOLAR LOGICAL CIRCUIT ARRANGEMENT FOR SIGNAL REGENERATION

The invention relates to a bipolar amplifier circuit arrangement and, more particularly, with transistors of one conduction type and having a differential amplifier stage formed by a first and second transistor with collectors coupled back crosswise to bases thereof and with emitters thereof connected to one terminal of a current source having another terminal which is at supply potential, the first and second transistor having a collector circuit wherein a respective resistance is connected.

Bipolar amplifiers or comparators compare two input signals and have either a high or a low output level, depending upon the decision or discrimination.

Frequently, the decision criterion is whether the difference of the input signals is positive or negative. It is desirable to have a small required signal excursion to keep the power loss, which is determined in a digital circuit primarily by the signal excursion and the given load resistance, as low as possible. On the other hand, a circuit capable of regeneration, the output amplitudes of which have a given level and are in the (high-frequency) clock raster, require given minimum signal excursions and a correspondingly large bandwidth.

According to the prior state of the art, comparator or operational amplifier circuits with high sensitivity, in order to attain a sufficiently high gain, require a number of components, frequently have a multistage construction or have current sources in the load circuit. These circuit measures or features limit the bandwidth, however.

Conventional comparator circuits in current switch technology, also called Current Mode Logic (CML), by which short switching times can be achieved because the transistors cannot go to saturation, require a signal excursion of about 500 mV in the current state of the art. Push-pull circuits operate yet with a signal excursion of about 200 mV, but the current for a 50-ohm load resistance continues to be 4 mA.

It is accordingly an object of the invention to provide a comparator with high sensitivity which is sufficiently capable of regeneration even with very small signal excursions and requires only few components.

With the foregoing and other objects in view, there is provided, in accordance with the invention, a bipolar semiconductor circuit arrangement with transistors of one conduction type having a differential amplifier stage formed by a first and a second transistor with collectors coupled back crosswise to bases thereof and with emitters thereof connected to one terminal of a current source having another terminal which is at supply potential, the first and second transistors having a collector circuit wherein a respective resistance is connected, comprising a pair of control transistors having collector-emitter paths connected between the respective resistances and the collectors of the first and the second transistors of the differential amplifier stage, the control transistors having respective base terminals connected to a source of complimentary input signals, and having respective collectors serving as a source of complementary output signals.

In accordance with a concomitant feature of the invention, a resistor is connected between the respective emitters of said control transistors.

Other features which are considered as characteristic for the invention are set forth in the appended claims.

Although the invention is illustrated and described herein as embodied in a bipolar amplifier circuit, it is nevertheless not intended to be limited to the detail shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

FIG. 3 is a plot diagram showing the relationship between the envelope or group delay time and the sensitivity of the inventive comparator circuit of the bipolar amplifier embodiment shown in FIG. 2.

Figure 1:
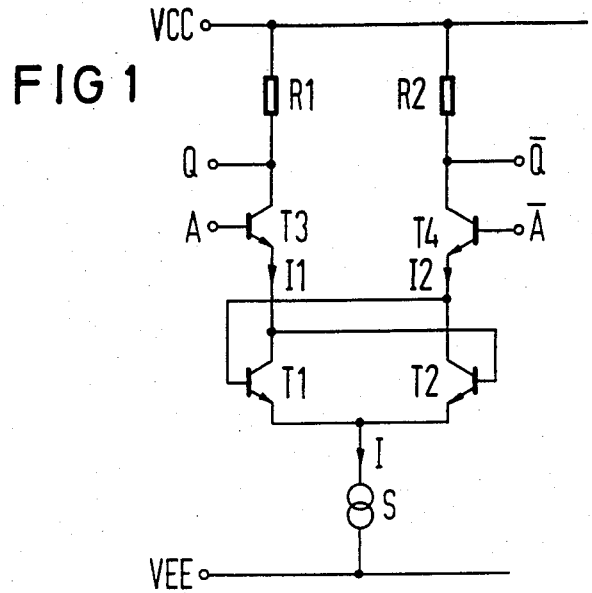
FIG. 1 is a circuit diagram of a first embodiment of a relatively simple bipolar amplifier constructed in accordance with the invention.

Referring now to the drawing and first, particularly, to FIG. 1, there is shown therein a circuit diagram of a bipolar amplifier according to the invention, which requires no complementary transistors. The circuit employs a differential amplifier stage with crosswise feedback, and diode paths in the load circuit. Emitters of transistors T1 and T2 forming the differential amplifier stage are connected to one another and to an output terminal of a current source S which has another terminal with a potential $V_{EE}$ of a supply voltage source. The current source S supplies a constant current I typically equal to 1 mA and improves the common-mode or in-phase rejection of the differential amplifier stage because of its very high internal resistance.

The transistor T1 has a collector which is fed or coupled back to the base of the transistor T2 and, simultaneously, connected to the emitter of a transistor T3, while the collector of the transistor T2 is fed or coupled back to the base of the transistor T1 and additionally connected to the emitter of the transistor T4. The base of the transistor T3 forms a noninverting input A of the amplifier and the noninverted output signal Q can be taken-off at the collector which is connected via a resistor R1 to a pole VCC of the supply voltage source. Correspondingly, an inverted input signal $\overline{A}$ is present at the base of the transistor T4 and an inverted output signal $\overline{Q}$ as well as one terminal of the resistor R2 at the collector of the transistor T4, the other terminal of the resistor R2 being connected to the pole VCC of the supply voltage source.

Assuming that the difference voltage $U(A) - U(\overline{A})$ becomes more positive i.e. U(A) rises and $U(\overline{A})$ drops, the transistor T3 conducts better and the transistor T4 begins to cut off. A higher current through the transistor T3 produces a higher base current of the transistor T2 which then likewise draws a greater current and the collector-emitter voltage thereof decreases. Due to the feedback of the collector of the transistor T2 to the base of the transistor T1 while the current through the transistor T4 is simultaneously low, the base current of the transistor T1 and, thereby, the collector current thereof decreases acceleratingly. Via the feedback of the collector of the transistor T1 to the base of the transistor T2, the base current of the latter, in turn, increases more intensely. The cycle lasts until the current I1 through the resistor R1 and the transistor T3 and T1 becomes a minimum and the current I2 through the resistor R2 and the transistors T4 and T2 becomes a maximum. "Maximum" means that the transistors must not go to saturation but, on the other hand, the voltage drop T2×R2 is sufficient for generating the signal $\bar{Q}$. In the other current path, the current T1 must become so small that a high potential is present at the output Q. Due to the positive feedback of T1 and T2, only minimum excursions are necessary for A and $\bar{A}$, respectively.

With the diode paths in the load circuit of the differential amplifier stage, the voltage drops at the differential amplifier can be compensated with the exception of the voltage drops caused by the base current. The partial compensation is sufficient to achieve a high differential current gain in the transition range i,e, the range of the input (difference) voltage which is required for changing the output signal by the signal excursion $\Delta I \times R$, and to increase the gain by a factor of $\beta/4$ when compared to a differential amplifier of current switch technology with a resistance load, $\beta$ being the small-signal current gain of the transistors. The transition voltage, defined as the voltage difference of the intersections of a straight line through the point of maximum slope of the function $U(Q)=f\ [U(A)-U(\bar{A})]$ with straight lines parallel to the abscissa through $U(Q)_{max,min}$(asymptotes) for very large amplitudes $(U(A)-U(\bar{A}))$, is only about 2 mV in the circuit of the inventive embodiment according to FIG. 1, and is thereby smaller by about a factor of 25 than the value applicable for a push-pull current switch arrangement.

The high sensitivity of the comparator circuit according to FIG. 1, on the other hand, is at the expense of the upper frequency limit and the signal propagation time, respectively. Besides the time constants given by the load resistance i.e. the resistances R1 and R2 as well as the low dynamic collector-emitter resistances of the control transistors T3 and T4, and the unavoidable parasitic capacitances, the slowing-down positive feedback of the transistors T1 and T2 are primarily responsible therefor.

Figure 2:
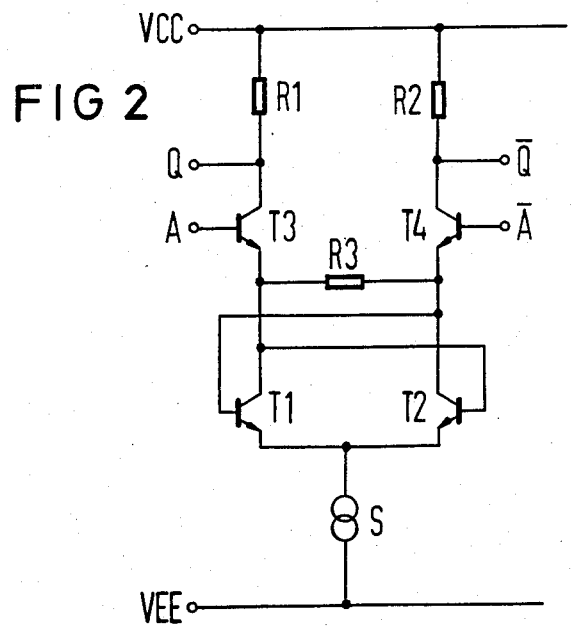
FIG. 2 is a circuit diagram of second embodiment of the bipolar amplifier.

In order to achieve a compromise between sensitivity and signal propagation time, it is especially advantageous to use the circuit of a bipolar amplifier according to the inventive embodiment which is shown in FIG. 2. FIG. 2 differs from FIG. 1 in that a resistor R3 is inserted and causes negative feedback. Like elements to those in FIG. 1 are identified by the same reference characters in FIG. 2.

The effects of different designs of the resistor R3 in FIG. 2 upon the signal propagation time and the sensitivity are shown in the plot diagram of FIG. 3, wherein the signal propagation time is plotted as a function of the transition voltage. For R3= ∞ (FIG. 1), the signal propagation time is a maximum and the transition voltage is a minimum. With smaller values of R3, the two variables initially vary in opposite directions until, for R3=1 kohm, the propagation time minimum of 0.75 ns is attained for a transition voltage of 10 mV. With yet smaller values of R3, the propagation time as well as the transition voltages increase again. At the optimum operating point for R3=1 kohm, a propagation time is attained which is longer by a factor of 3, for a simultaneous reduction of the input transition voltage, when compared with a push-pull current switch comparator having the same (50 ohm) resistive load and the same current, the input transition voltage being simultaneously reduced by a factor of 5.

In large-scale integrated circuits, the signal propagation time has only a slight effect because the path propagation times are already large; the smaller signal excursions determining the power loss, on the other hand, constitute a considerable advance towards the sought-after, even higher integration densities.

The foregoing is a description corresponding in substance to German Application P No. 34 18 214.4, dated May 16, 1984, the International priority of which is being claimed for the instant application, and which is hereby made part of this application. Any material discrepancies between the foregoing specification and the aforementioned corresponding German application are to be resolved in favor of the latter.

We claim:

1. Bipolar semiconductor circuit arrangement with transistors of one conduction type having a differential amplifier stage formed by a first and a second transistor with collectors coupled back crosswise to bases thereof and with emitters thereof connected to one terminal of a current source having another terminal which is at supply potential, the first and second transistor each having a collector circuit wherein a respective resistance is connected, comprising a pair of control transistors having respective collectors and emitters and respective collector-emitter paths connected between the respective resistances and the collectors of the first and the second transistors of the differential amplifier stage, said control transistors having respective base terminals connected to a source of complementary input signals, the respective collectors of said control transistors serving as a source of complementary output signals, and a resistor connecting the respective emitters to one another for causing negative feedback.

* * * * *